United States Patent
Thorp et al.

(10) Patent No.: US 6,604,226 B2
(45) Date of Patent: Aug. 5, 2003

(54) VERIFYING ON-CHIP DECOUPLING CAPACITANCE USING TRANSISTOR AND CAPACITOR SURFACE AREA INFORMATION

(75) Inventors: Tyler Thorp, Sunnyvale, CA (US); Devendra Vidhani, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 34 days.

(21) Appl. No.: 09/990,078

(22) Filed: Nov. 21, 2001

(65) Prior Publication Data

US 2003/0097646 A1 May 22, 2003

(51) Int. Cl.[7] .................................. G06F 9/45
(52) U.S. Cl. .................................. 716/5; 716/4
(58) Field of Search .......................... 716/4, 5

(56) References Cited

U.S. PATENT DOCUMENTS

| | | | | |
|---|---|---|---|---|
| 6,446,016 B1 | * | 9/2002 | Zhu | 702/69 |
| 6,477,694 B1 | * | 11/2002 | Irino et al. | 716/15 |
| 6,480,992 B1 | * | 11/2002 | Runyon | 716/10 |
| 6,487,702 B2 | * | 11/2002 | Lin et al. | 716/4 |
| 6,523,159 B2 | * | 2/2003 | Bernstein et al. | 716/10 |
| 6,532,439 B2 | * | 3/2003 | Anderson et al. | 703/14 |
| 2002/0144217 A1 | * | 10/2002 | Lin et al. | 716/4 |

OTHER PUBLICATIONS

Chen, H.H. et al., "On–chip decoupling capacitor optimization for high performance vlsi design", May 1995, IEEE, pp. 99–103.*

* cited by examiner

Primary Examiner—John F. Niebling
Assistant Examiner—Stacy Whitmore
(74) Attorney, Agent, or Firm—Rosenthal & Osha L.L.P.

(57) ABSTRACT

A technique for verifying on-chip decoupling capacitance using transistor and capacitor surface area information is provided. The technique broadly includes determining a surface area of a transistor, determining a surface area of a decoupling capacitor, comparing the surface area of the transistor to the surface area of the decoupling capacitor to obtain a surface area ratio, and verifying whether there is enough decoupling capacitance based on the surface area ratio. Further, the present invention also provides a technique for determining when and how to redesign a microprocessor in order to have sufficient decoupling capacitance.

27 Claims, 8 Drawing Sheets

VERIFYING ON-CHIP DECOUPLING CAPACITANCE USING TRANSISTOR AND CAPACITOR SURFACE AREA INFORMATION

BACKGROUND OF INVENTION

Power consumption of modern computers has increased as a result of increased operating frequencies. Power consumption requirements of various components, e.g., microprocessors, within a modern computer system need to be met in order to sustain these increased operating frequencies. Thus, providing power to components within a computer system in an accurate and predictable manner is of critical importance.

Ultra Large-Scale Integrated ("ULSI") and Very Large-Scale Integrated ("VLSI") circuits have strict requirements on signal integrity. In ULSI and VLSI circuits, transistors may switch very rapidly and draw significant amounts of current. Thus, there is a relative short amount of time during which a ULSI or VLSI circuit dissipates significant amounts of current. With increasing transistor densities on ULSI and VLSI circuits, this current requirement may lead to potential power problems and various signal integrity issues.

To overcome such performance inhibitions, one or more decoupling capacitors are positioned near a transistor to store charge. When needed, these decoupling capacitors distribute this stored energy to the required transistors. In essence, decoupling capacitors act as local power supplies for particular discrete elements, e.g., transistors, etc. This is necessary because a power supply for a computer system component, such as a computer integrated circuit, typically resides at some distance from discrete elements on the integrated circuit. Therefore, a discrete element may not get power (via current) at the exact time it is required.

It follows that an important concern for designers is to ensure that transistors have enough decoupling capacitance. Referring to FIG. 1a, to verify that there is enough decoupling capacitance on an integrated circuit 10, a designer selects one of several areas 11 on the integrated circuit 10, chooses a particular signal in that area (not shown), and verifies that there is enough decoupling capacitance associated with that particular signal. However, this verification process does not guarantee that there is enough decoupling capacitance within a given distance of a particular transistor.

Such a guarantee is important because driver delay, i.e., transistor delay, depends on how quickly power is transferred from a power supply or a decoupling capacitor to a particular driver. Typically, power transfer from a power supply is slower than power transfer from a decoupling capacitor. Thus, it is imperative that a decoupling capacitor have enough decoupling capacitance within a relatively close proximity to a particular driver. The faster a driver receives power, the faster a signal driven by the driver may switch, effectively increasing the performance of the integrated circuit. FIG. 1b shows an expansion 12 of one of the areas 11 on the computer integrated circuit 10 shown in FIG. 1a. The expanded area 12 has decoupling capacitors 14 and transistors 16. Power supply lines 18 provide power to the decoupling capacitors 14 and transistors 16. The transistors 16, in turn, drive discrete other integrated circuit components (not shown) on the integrated circuit 10 by providing signals to them. The decoupling capacitors 14 store charge from the power supply lines 18 for distribution, as needed, to the transistors 16.

Thus, there is a need for a technique that verifies an amount of decoupling capacitance on an integrated circuit with respect to power needs of transistors on the integrated circuit.

SUMMARY OF INVENTION

According to one aspect of the present invention, a method for verifying decoupling capacitance on an integrated circuit having a transistor and a decoupling capacitor comprises determining a surface area of the decoupling capacitor, determining a surface area of the transistor, defining a surface area ratio as a ratio of the surface area of the decoupling capacitor to the surface area of the transistor, and comparing the surface area ratio to a predefined range, wherein the range is between a predefined lower value and a predefined upper value.

According to another aspect, a computer system comprises a memory and a processor, wherein instructions residing in the memory are executed on the processor for determining a ratio of a surface area of a decoupling capacitor to a surface area of a transistor and verifying decoupling capacitance on an integrated circuit using the ratio.

According to another aspect, an apparatus that verifies an amount of decoupling capacitance on a microprocessor comprises means for determining a surface area of a transistor and a surface area of a decoupling capacitor, means for comparing the surface area of the decoupling capacitor to the surface area of the transistor, and means for determining whether there is sufficient decoupling capacitance based on the comparison.

According to another aspect, a method for designing a microprocessor comprises determining an amount of decoupling capacitance required by the microprocessor, verifying the amount of decoupling capacitance on the microprocessor (where verifying the amount of decoupling capacitance comprises obtaining a ratio using surface area information of a decoupling capacitor and a transistor and comparing the ratio to a predefined lower value and an upper value), and redesigning the microprocessor based on the comparison.

Other aspects and advantages of the invention will be apparent from the following description and the appended claims.

BRIEF DESCRIPTION OF DRAWINGS

FIG. 1b shows a portion of the typical integrated circuit shown in FIG. 1a.

DETAILED DESCRIPTION

Figure 1A:
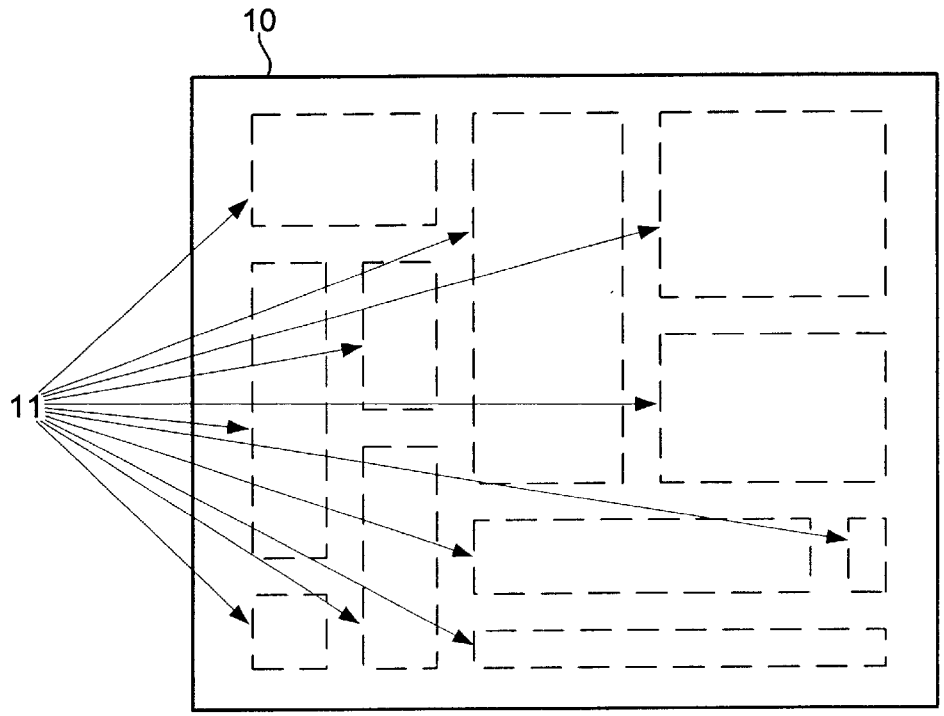
FIG. 1a shows a typical integrated circuit.
Figure 1B:
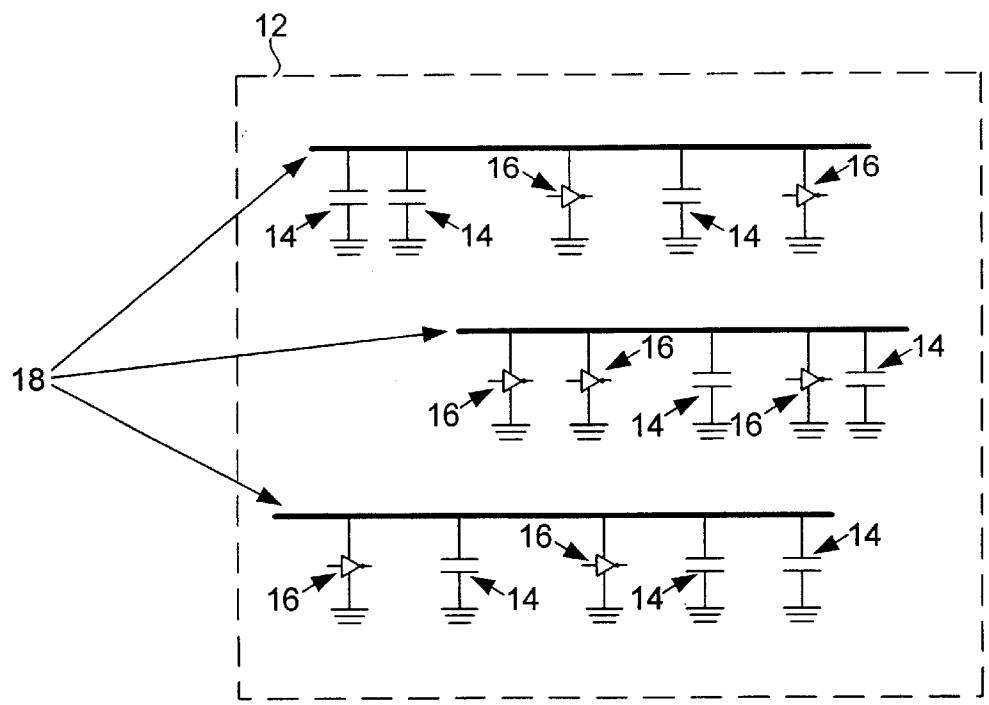

Exemplary embodiments of the invention will be described with reference to the accompanying drawings. Like items in the drawings are shown with the same reference numbers.

In order to determine if there is sufficient decoupling capacitance on an integrated circuit, or in a particular "window" of the integrated circuit, the present invention uses surface area values of one or more decoupling capacitors and transistors residing on the integrated circuit. Particularly, the surface area values of the one or more decoupling capacitors are used to obtain a ratio of available decoupling capacitance to capacitance need. Using this ratio, a designer may verify whether there is sufficient decoupling capacitance on the integrated circuit, and if not, the designer may redesign the integrated circuit in order to have sufficient decoupling capacitance.

Figure 2B:
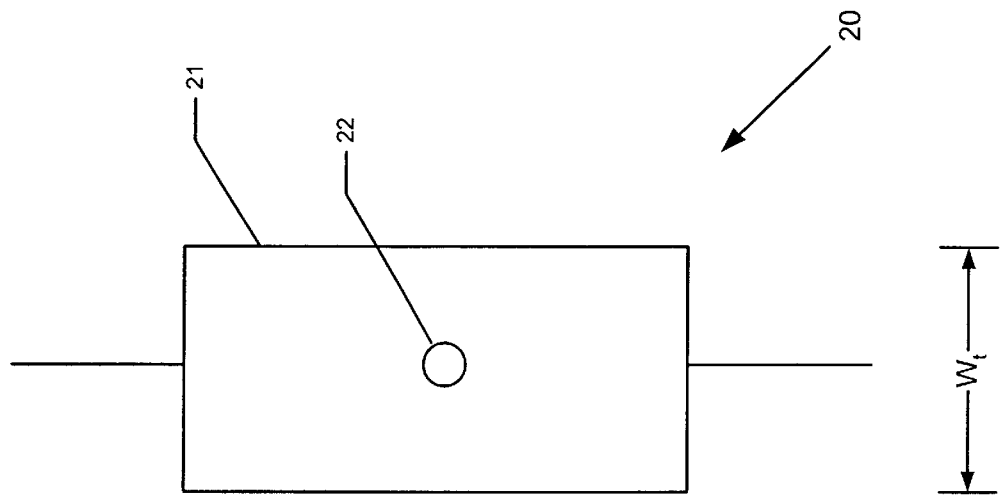
FIG. 2b shows a front view of a transistor.
Figure 2A:
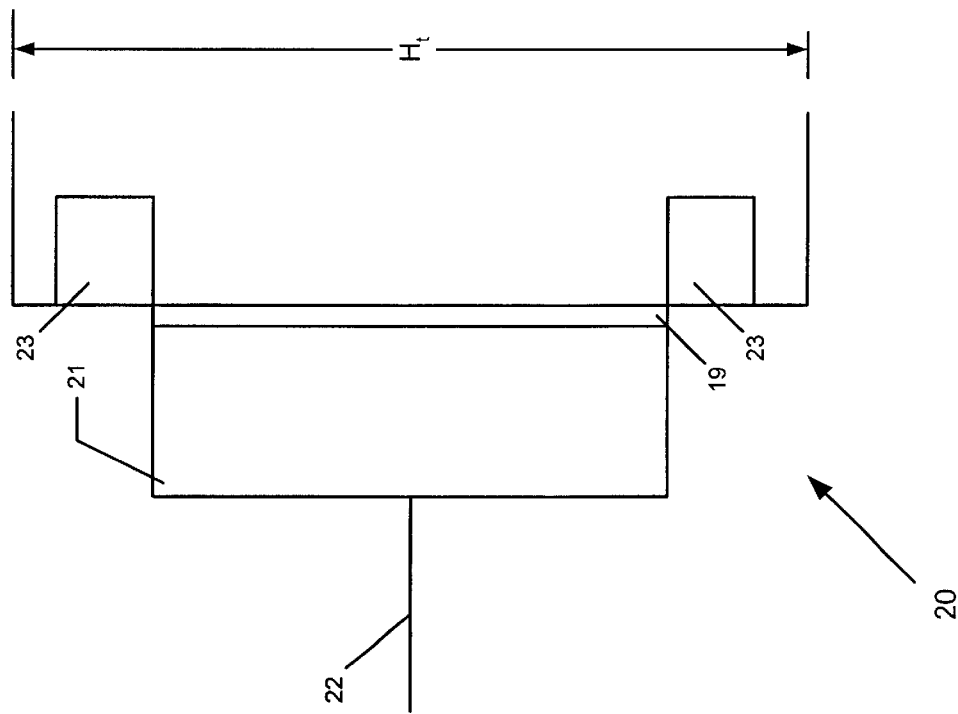
FIG. 2a shows a side view of a transistor.

Referring to FIGS. 2a and 2b, a transistor 20 has a polysilicon layer 21 and a metallic layer 22 that are separated from a diffusion layer 23 by a gate oxide layer 19. The transistor surface area ($SA_{transistor}$) is defined as the area of overlap region between the polysilicon layer 21 and the diffusion layer 23, and is defined by following equation:

$$SA_{transistor} = W_t * H_t \quad (1)$$

where $W_t$ represents the width of the overlap region and $H_t$ is the height of the overlap region. The surface area of a transistor, $SA_{transistor}$, is proportional to an amount of charge dissipated by the transistor.

Figure 3B:
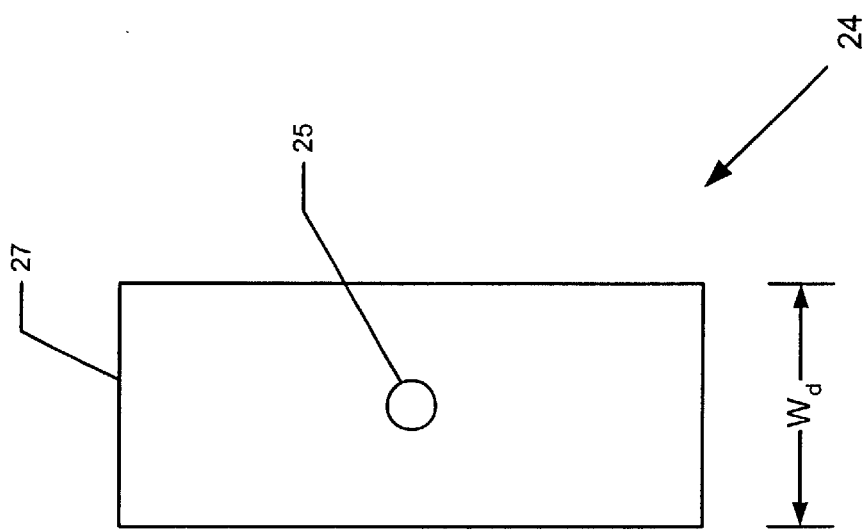
FIG. 3b shows a front view of a decoupling capacitor.
Figure 3A:
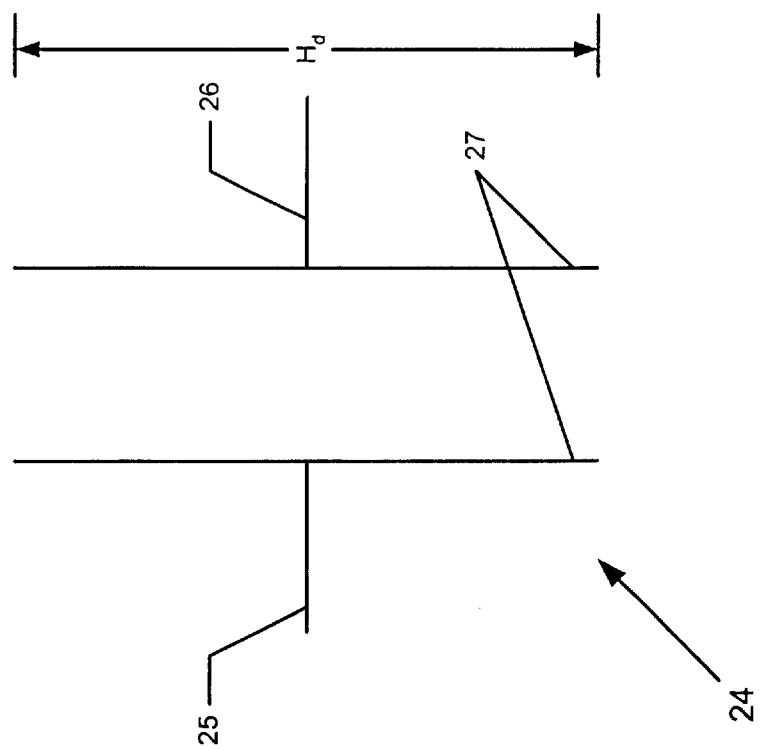
FIG. 3a shows a side view of a decoupling capacitor.

Referring to FIGS. 3a and 3b, a decoupling capacitor 24 has an input connector 25, an output connector 26, and two parallel plates 27 that store charge. The decoupling capacitor surface area ($SA_{decap}$) is defined by the following equation:

$$SA_{decap} = W_d * H_d \quad (2)$$

where $W_d$ represents the width of the decoupling capacitor plates and $H_d$ represents the height of the decoupling capacitor plates. The surface area of a decoupling transistor, $SA_{decap}$, is proportional to an amount of charge stored by the decoupling capacitor.

The present invention uses the aforementioned surface area information of one or more transistor and decoupling capacitors to determine a surface area ratio. This ratio is representative of the amount of decoupling capacitance available compared to the amount of decoupling capacitance that is required.

The surface area ratio may be compared to a lower value determined by a circuit designer. The lower value corresponds to the minimum amount of decoupling capacitance that a circuit designer determines is necessary for a particular set of transistors. For example, for a given integrated circuit, the circuit designer may determine that the integrated circuit must store at least twice the amount of charge that may be dissipated by transistors. Thus, in this scenario, the lower value is 2. When the surface area ratio is compared to the lower value and if it has less than twice the amount of stored charge as compared to dissipated charge, then the integrated circuit may be re-designed to meet this requirement.

Thus, the present invention enables a circuit designer to identify cases where there is deficient decoupling capacitance. By noting that there is deficient decoupling capacitance, the circuit designer may re-design the circuit with (1) more decoupling capacitors, (2) decoupling capacitors having larger surface areas, (3) less transistors, or (4) transistors having smaller surface areas.

Similarly, the surface area ratio may be compared to an upper value determined by a circuit designer. The upper value corresponds to a maximum amount of excess decoupling capacitance allowed above the lower value for a given integrated circuit. Returning to the scenario above, consider that a circuit designer determines an upper value of 4, i.e., an integrated circuit having four times the amount of stored charge compared to dissipated charge. If the surface area ratio is above the upper value, the circuit designer may re-design the circuit to decrease the surface area ratio to a value between the lower and upper values.

The present invention enables a circuit designer to identify cases where there is excess decoupling capacitance. By noting that there is excess decoupling capacitance, the circuit designer may re-design the circuit with (1) less decoupling capacitors, (2) decoupling capacitors having smaller surface areas, (3) more transistors, or (4) transistors having larger surface areas.

The lower and upper values provide the designer with a range, where a ratio below the range indicates that the integrated circuit is deficient in decoupling capacitance, and where a ratio above the range indicates that the circuit has excess decoupling capacitance.

Figure 4:
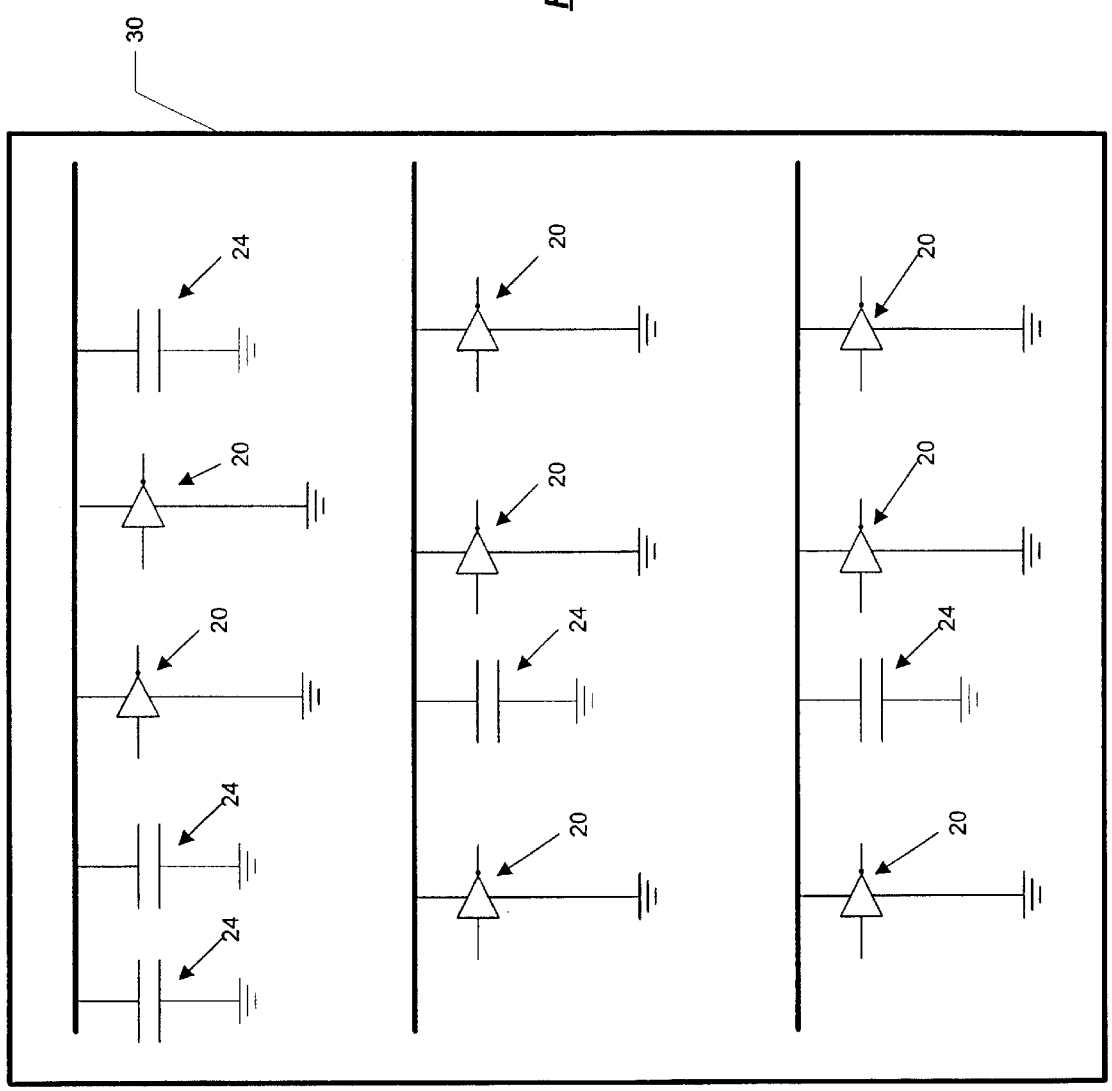
FIG. 4 shows an integrated circuit in accordance with an embodiment of the present invention.
Figure 5:
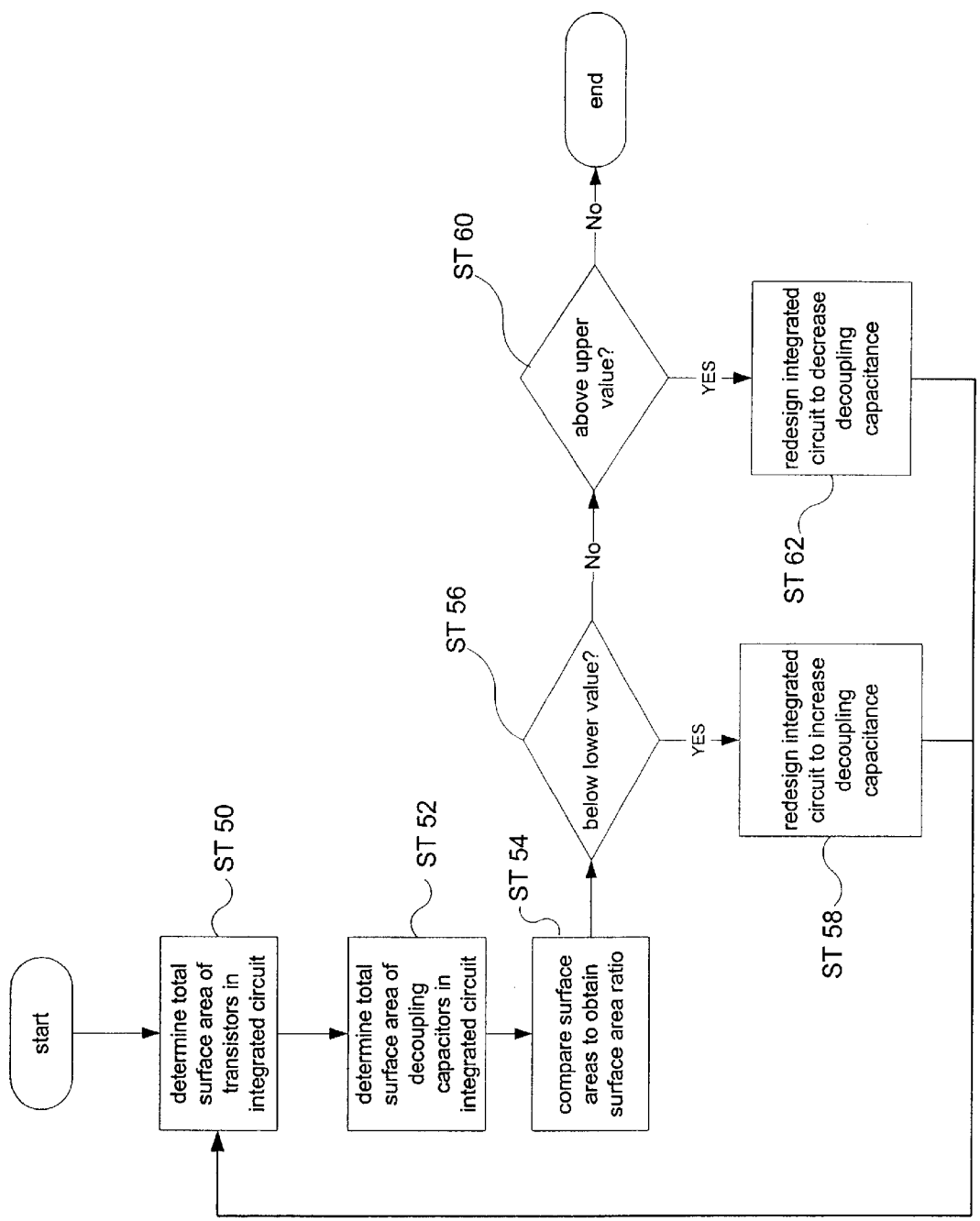
FIG. 5 shows an exemplary flow process in accordance with the embodiment shown FIG. 4.

Referring to FIG. 4, an exemplary technique to verify local decoupling capacitance is shown in accordance with an embodiment of the present invention. Particularly, an integrated circuit 30 is viewed a whole. FIG. 5 shows an exemplary flow process in accordance with the embodiment shown in FIG. 4. A total surface area of the transistors 20 on the integrated circuit 30 is determined (step 50) and a total surface area of the decoupling capacitors 24 on the integrated circuit 30 is determined (step 52). The total surface area of the decoupling capacitors 24 is then compared to the total surface area of the transistors 20 in order to obtain a surface area ratio (step 54). If the surface area ratio is below a lower value (step 56), the integrated circuit 30 is considered to have deficient decoupling capacitance. Those skilled in the art may then redesign the integrated circuit 30 to have sufficient decoupling capacitance (step 58). If the surface area ratio is above an upper value (step 60), the integrated circuit 30 is considered to have excess decoupling capacitance. In this case, those skilled in the art may also redesign the integrated circuit 30 to have sufficient decoupling capacitance (step 62). After redesigning the integrated circuit 30 (step 58 or 62), a designer may return to determine the total surface area of the transistors 20 (step 50) and total surface area of the decoupling capacitors 24 (step 52) in order to ensure that the sufficient decoupling capacitance now exists, i.e. the surface area ratio falls between the lower and upper value.

Figure 6:
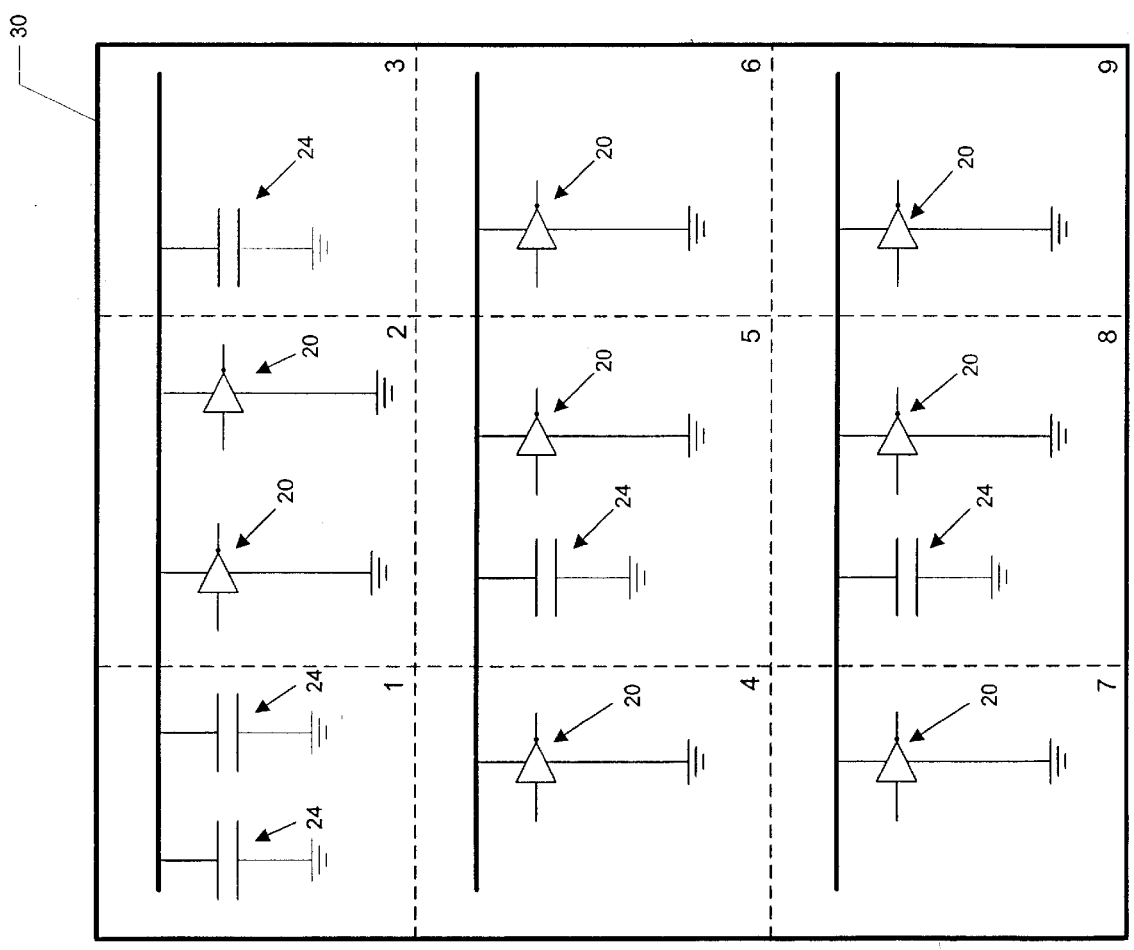
FIG. 6 shows an integrated circuit in accordance with another embodiment of the present invention.
Figure 7:
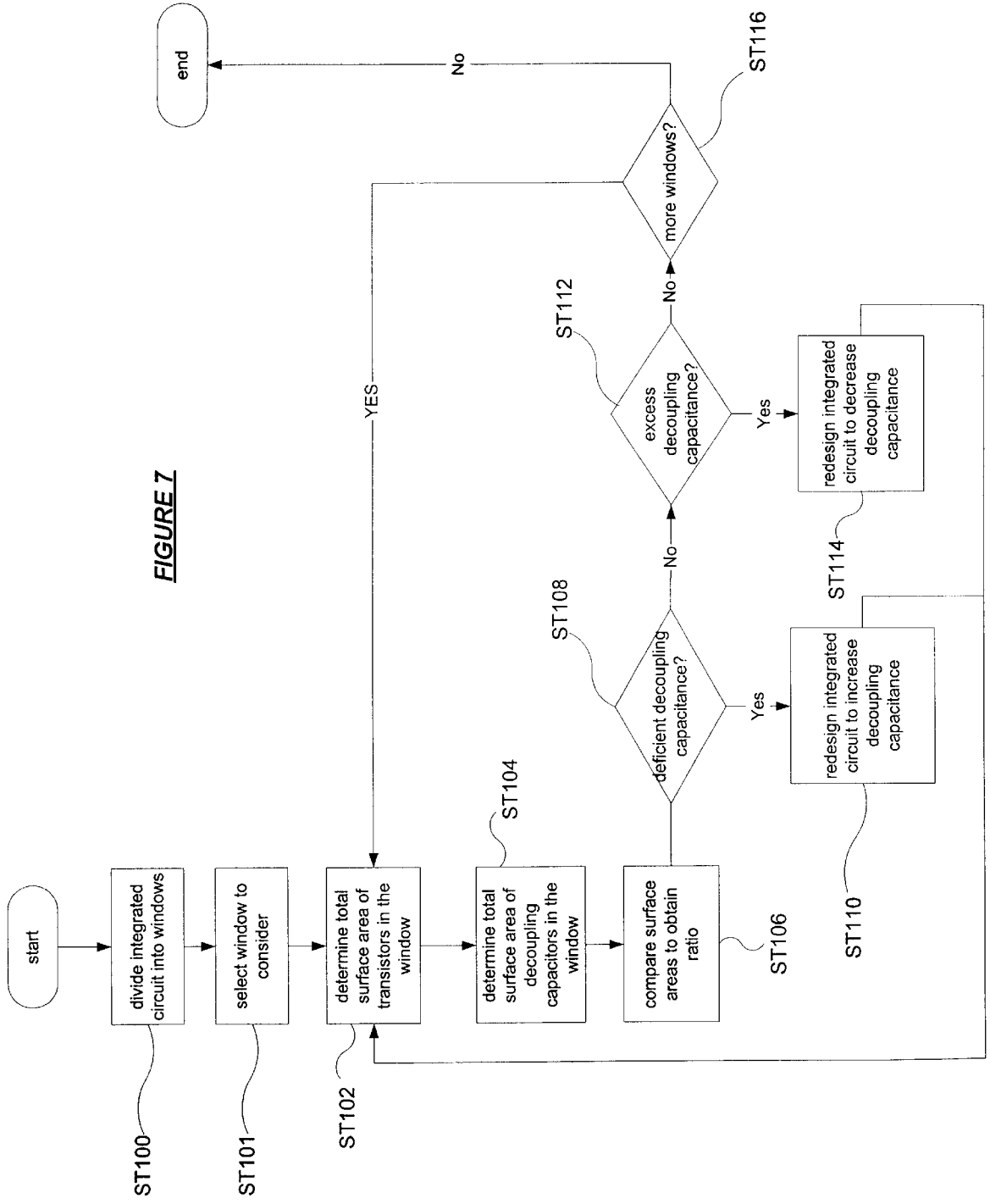
FIG. 7 shows an exemplary flow process in accordance with the embodiment shown in FIG. 6.

Referring to FIG. 6, an exemplary technique to verify local decoupling capacitance is shown in accordance with another embodiment of the present invention. Particularly, an integrated circuit 30 is viewed a series of windows, i.e., sections of the integrated circuit 30. FIG. 7 shows an exemplary flow process in accordance with the embodiment shown in FIG. 6. As shown, the integrated circuit 30 is divided into a number of "windows"(step 100). For the purpose of illustrating the principles of the present invention, the integrated circuit is divided into nine rectangular "windows." A particular window is selected (step 101). A total surface area of the transistors 20 within the window is determined (step 102) and a total surface area of the decoupling capacitors 24 within the window is determined (step 104). The total surface area of the decoupling capacitors 24 is compared to the total surface area of the transistors 20 to obtain a surface area ratio for the particular window currently being considered (step 106).

If the surface area ratio for the window is below a lower value (step 108), the window is considered to have deficient decoupling capacitance. That portion of the integrated circuit within the window may then be redesigned (step 110) by (1) adding more decoupling capacitors, (2) using decoupling capacitors with larger surface areas, (3) removing transistors, or (4) using transistors with smaller surface areas.

If the window has a surface area ratio greater than an upper value (step 112), the window is considered to have excess decoupling capacitance. In this case, that portion of the integrated circuit within the window may then be redesigned (step 114) by (1) removing decoupling capacitors, (2) using decoupling capacitors with smaller surface areas, (3) adding transistors, or (4) using transistors having larger surface areas.

This process of determining whether a window has deficient or excess decoupling capacitance may be repeated for other windows on the integrated circuit 30 (step 116) that a designer wants to verify decoupling capacitance on. Those skilled in the art will appreciate that although the windows shown in FIG. 6 have a particular size and shape, other embodiments may use windows of other shapes and sizes. Further, it is important to note that the selection of window sizes and shapes may be limited so as to ensure that a capacitor that does not have an effect on a particular transistor (due to distance between the capacitor and the transistor) is not included in the same window as that particular transistor.

In another embodiment of the present invention, a circuit designer first uses the present invention to determine if an integrated circuit as a whole has sufficient decoupling capacitance. If the circuit designer finds that the integrated circuit is deficient in decoupling capacitance or has an excess of decoupling capacitance, she may then use the present invention to isolate particular areas within an integrated circuit that are deficient or that have excess decoupling capacitance. Specifically, the circuit designer could divide the integrated circuit into particular windows and then determine, for each window, whether there is deficient decoupling capacitance or excess decoupling capacitance within that particular window. The present invention allows a circuit designer to readily determine if a particular integrated circuit has sufficient decoupling capacitance. If the integrated circuit has excess decoupling capacitance or deficient decoupling capacitance, the present invention allows a circuit designer to readily isolate particular areas on the integrated circuit that possess excess decoupling capacitance or deficient decoupling capacitance. Once these particular areas have been isolated, the circuit designer may then choose to re-design them to either increase or decrease the amount of decoupling capacitance that is available depending on the situation.

In another embodiment of the present invention, a particular window that is deficient in decoupling capacitance or that has excess decoupling capacitance may be further sub-divided into smaller windows to isolate particular regions within the window that are deficient or that have excessive decoupling capacitance.

In another embodiment, the present invention uses a sliding window technique. For example, in the sliding window technique, a window of a certain size may first be created, e.g., a rectangle that is 0.2 mm by 0.3 mm. The window is then placed on the top left corner of the integrated circuit. Then the aforementioned process of verifying if there is sufficient decoupling capacitance is carried out. Once this has been completed, the circuit designer slides the window one window width across, i.e., 0.2 mm, and repeats the process. When the window reaches the right edge of the integrated circuit, the window is slid back to the left edge of the integrated circuit and down one window height, i.e., 0.3 mm. This process is repeated until the window has slid over the complete integrated circuit. Those skilled in the art will appreciate that the windows used in other embodiments may be of different sizes and shapes.

Figure 8:
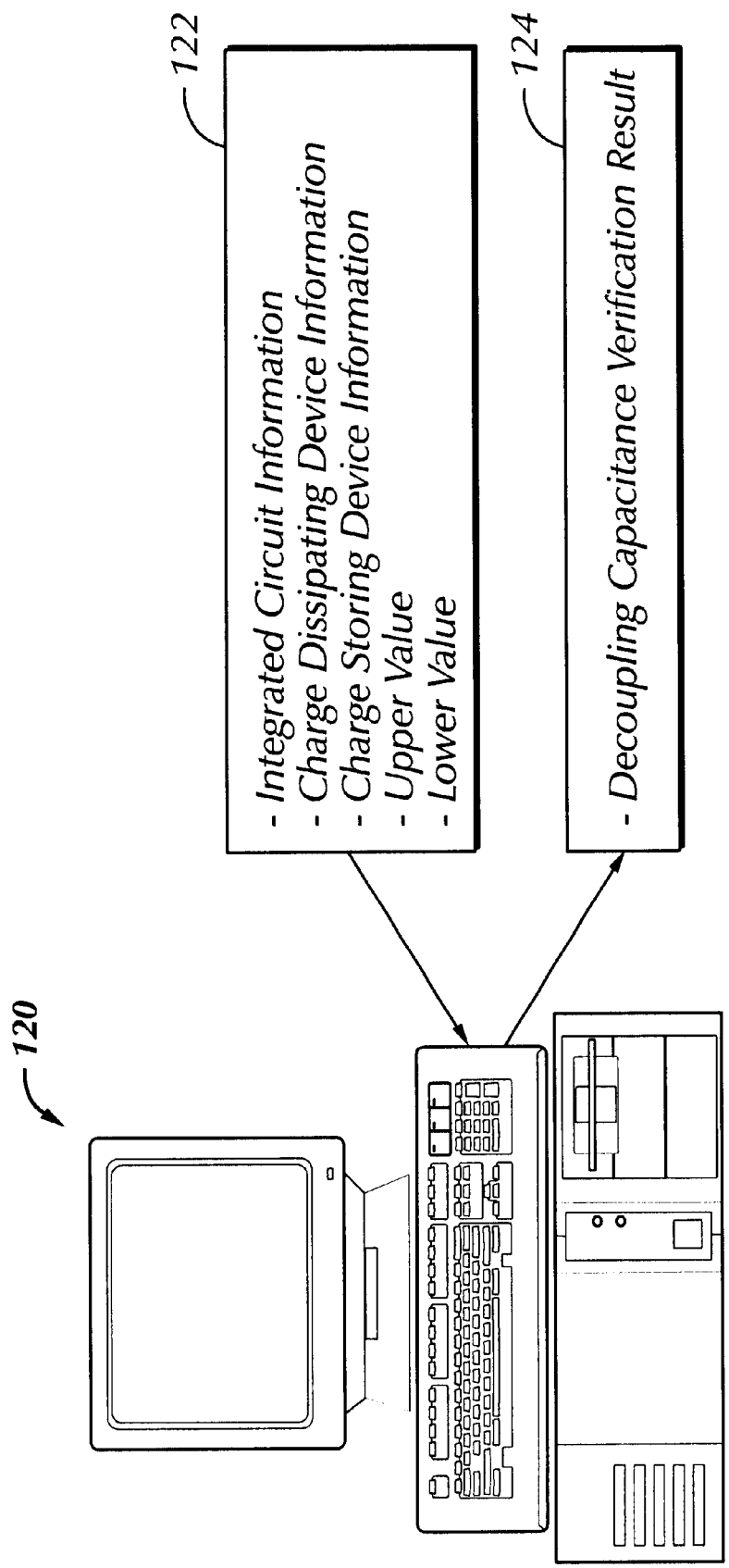
FIG. 8 shows a computer system in accordance with an embodiment of the present invention.

FIG. 8 shows an exemplary computer system 120 that verifies decoupling capacitance in accordance with an embodiment of the present invention. Input parameters 122 include integrated circuit information, information, e.g., size, location, etc., for one or more charge dissipating devices residing on an integrated circuit, information, e.g., size, location, etc., for one or more charge storing devices residing on the integrated circuit, a lower value representing a minimum desired ratio amount of surface areas of charge storing devices to surface areas of charge dissipating devices, and an upper value representing a maximum desired ratio amount of surface areas of charge storing devices to surface areas of charge dissipating devices. One of ordinary skill in the art will understand that the input parameters 122 may include additional parameters dependent on whether decoupling capacitance is being verified for a particular area on the integrated circuit or for the integrated circuit as a whole.

The input parameters 122 serve as input data to the computer system 120 via some computer-readable medium, e.g., network path, floppy disk, input file, etc. The computer system 120 then stores the input parameters 122 in memory (not shown) to subsequently determine (via microprocessor functions) whether there is sufficient decoupling capacitance for an area being considered. Thereafter, the computer system 120 outputs a result 124 via some user-readable medium, e.g., monitor display, network path, etc., where the result 124 includes indications as to whether the surface area ratio is below the lower value or above the upper value, where after, a designer may use the result 124 to redesign the integrated circuit. The computer system 120 may additionally output the amount of charge dissipated and charge stored for a particular operation of the integrated circuit.

Those skilled in the art will appreciate that in other embodiments, a software program capable of verifying decoupling capacitance using the techniques presented in the present invention may be used. The software program may also be capable of determining charge storage and charge dissipation values corresponding to the surface area ratio obtained from particular input information.

While the present invention is described using a transistor as the sole element that dissipates charge, those skilled in the art will appreciate that this method may be applied to any element on an integrated circuit where the surface area of the element is proportional to the charge dissipated by the element.

The present invention has one or more of the following advantages. In some embodiments, because decoupling capacitance may be verified, circuit performance is increased due to less power supply voltage variations on circuit elements.

In some embodiments, because decoupling capacitance may be verified from a whole-circuit perspective, a determination may be made as to whether the circuit needs to be redesigned due to deficient or excessive decoupling capacitance.

In some embodiments, because decoupling capacitance may be verified using portions, i.e., "windows," of an integrated circuit, a determination may be made as to whether one or more portions of the circuit need to be redesigned due to deficient or excessive decoupling capacitance.

In some embodiments, because a method to verify decoupling capacitance is efficient and non-intrusive, a circuit designer may readily identify one or more areas of deficient and excessive decoupling capacitance for subsequent redesign.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for verifying decoupling capacitance on an integrated circuit having a transistor and a decoupling capacitor, comprising:
    determining a surface area of the decoupling capacitor;
    determining a surface area of the transistor;
    defining a surface area ratio as a ratio of the surface area of the decoupling capacitor to the surface area of the transistor; and
    comparing the surface area ratio to a predefined range, wherein the range is between a predefined lower value and a predefined upper value.

2. The method of claim 1, wherein the lower value represents a minimum desired amount of the surface area ratio.

3. The method of claim 1, wherein the upper value represents a maximum desired amount of the surface area ratio.

4. The method of claim 1, wherein the surface area ratio proportionally represents a ratio of an amount of charge stored by the decoupling capacitor to an amount of charge dissipated by the transistor.

5. The method of claim 1, further comprising:
    determining if the surface area ratio is below the lower value; and
    if the surface area ratio is below the lower value, increasing the surface area ratio.

6. The method of claim 5, wherein increasing the surface area ratio comprises increasing the surface area of the decoupling capacitor.

7. The method of claim 5, wherein increasing the surface area ratio comprises disposing another decoupling capacitor on the integrated circuit.

8. The method of claim 5, wherein increasing the surface area ratio comprises decreasing the surface area of the transistor.

9. The method of claim 5, wherein increasing the surface area ratio comprises removing a transistor from the integrated circuit.

10. The method of claim 1, further comprising:
    determining if the surface area ratio is above the upper value; and
    if the surface area ratio is above the upper value, decreasing the surface area ratio.

11. The method of claim 10, wherein decreasing the surface area ratio comprises decreasing the surface area of the decoupling capacitor.

12. The method of claim 10, wherein decreasing the surface area ratio comprises removing a decoupling capacitor on the integrated circuit.

13. The method of claim 10, wherein decreasing the surface area ratio comprises increasing the surface area of the transistor.

14. The method of claim 10, wherein decreasing the surface area ratio comprises adding another transistor on the integrated circuit.

15. The method of claim 1, further comprising:
    defining a second surface area ratio as a ratio of the surface area of the transistor to the surface area of the decoupling capacitor; and
    comparing the second surface area ratio to a predefined range, wherein the range is between a predefined lower value and a predefined upper value.

16. The method of claim 1, further comprising:
    creating a window on a portion of an integrated circuit, wherein the transistor and decoupling capacitor reside in the window;
    selectively redesigning the portion of the integrated circuit based on the surface area ratio; and
    sliding the window onto another portion of the integrated circuit, wherein the different section comprises another transistor and another decoupling capacitor.

17. The method of claim 16, further comprising:
    determining a surface area of the another transistor;
    determining a surface area of the another decoupling capacitor;
    defining a second surface area ratio as a ratio of the surface area of the another decoupling capacitor to the surface area of the another transistor;
    comparing the second surface ratio to predefined lower and upper values; and
    selectively redesigning the another portion of the integrated circuit based on the comparison.

18. A computer system, comprising:
    a memory; and
    a processor,
    wherein instructions residing in the memory are executed on the processor for determining a ratio of a surface area of a decoupling capacitor to a surface area of a transistor and verifying decoupling capacitance on an integrated circuit using the ratio.

19. The computer system of claim 18, wherein the decoupling capacitor and the transistor reside on the integrated circuit.

20. An apparatus that verifies an amount of decoupling capacitance on a microprocessor, comprising:
    means for determining a surface area of a transistor and a surface area of a decoupling capacitor;
    means for comparing the surface area of the decoupling capacitor to the surface area of the transistor; and
    means for determining whether there is sufficient decoupling capacitance based on the comparison.

21. A method for designing a microprocessor, comprising:
    determining an amount of decoupling capacitance required by the microprocessor;
    verifying the amount of decoupling capacitance on the microprocessor, wherein verifying the amount of decoupling capacitance comprises obtaining a ratio using surface area information of a decoupling capacitor and a transistor, and comparing the ratio to a predefined lower value and an upper value; and
    redesigning the microprocessor based on the comparison.

22. The method of claim 21, wherein the microprocessor comprises the decoupling capacitor and the transistor.

23. The method of claim 21, wherein obtaining the ratio comprises:
    determining a surface area of the decoupling capacitor;
    determining a surface area of the transistor; and defining the ratio as a ration of the surface area of the decoupling capacitor to the surface area of the transistor.

24. The method of claim 21, wherein redesigning the microprocessor comprises increasing the ratio when the ratio is below the lower value, and wherein increasing the ratio comprises at least one selected from the group consisting of increasing the surface area of the decoupling capacitor, disposing another decoupling capacitor on the microprocessor, decreasing the surface area of the transistor, and removing a transistor from the microprocessor.

25. The method of claim 21, wherein redesigning the microprocessor comprises decreasing the ratio when the ratio is above the upper value, and wherein decreasing the ratio comprises at least one selected from the group consisting of increasing the surface area of the transistor, disposing another transistor on the microprocessor, decreasing the surface area of the decoupling capacitor, and removing a decoupling capacitor from the microprocessor.

26. The method of claim 21, further comprising:

dividing the microprocessor into a plurality of windows, wherein a window section comprises the transistor and the decoupling capacitor; and redesigning the window based on the comparison.

27. The method of claim 21, further comprising:

creating a window on a portion of the microprocessor, wherein the window comprises the transistor and the decoupling capacitor;

redesigning the portion of the microprocessor based on the comparison;

relocating the window to another portion of the microprocessor, wherein the another portion comprises another transistor and another decoupling capacitor; and selectively redesigning the another portion of the microprocessor based on a ratio of a surface area of the another decoupling capacitor to a surface area of the another transistor.

* * * * *